United States Patent [19]
Meyer

[11] Patent Number: 6,049,251
[45] Date of Patent: Apr. 11, 2000

[54] WIDE-DYNAMIC-RANGE VARIABLE-GAIN AMPLIFIER

[75] Inventor: Robert Godfrey Meyer, Berkeley, Calif.

[73] Assignee: Maxim Integrated Products, Inc., Sunnyvale, Calif.

[21] Appl. No.: 09/050,499

[22] Filed: Mar. 30, 1998

[51] Int. Cl.$^7$ ..................................................... H03F 3/45
[52] U.S. Cl. .................... 330/254; 330/295; 330/124 R; 330/126; 455/129
[58] Field of Search .................................. 330/254, 295, 330/124 R, 126; 455/129

[56] References Cited

U.S. PATENT DOCUMENTS

| | | | |
|---|---|---|---|
| 4,370,681 | 1/1983 | Akagiri | 360/68 |
| 5,008,631 | 4/1991 | Scherer et al. | 330/51 |
| 5,548,246 | 8/1996 | Yamamoto et al. | 330/295 |
| 5,821,824 | 10/1998 | Mentzer | 330/295 |
| 5,874,857 | 2/1999 | Roth et al. | 330/254 |

FOREIGN PATENT DOCUMENTS

| | | |
|---|---|---|
| 52119850 | 10/1977 | Japan . |
| 2-308606 | 12/1990 | Japan . |
| 2 279 788 | 1/1995 | United Kingdom . |

OTHER PUBLICATIONS

Mamoru Ohara, et al., High Gain Equalizing Amplifier Integrated Circuits for a Gigabit Optical Repeater, The Journal of Solid–State Circuits, Jun., 1985, pp. 703–707, vol. SC–20, No. 3.

Alan B. Grebene, Bipolar and MOS Analog Integrated Circuit Design, pp. 443–450, John Wiley & Sons, Inc., 1984, New York.

*Primary Examiner*—Michael B Shingleton
*Attorney, Agent, or Firm*—Blakely, Sokoloff, Taylor & Zafman LLP

[57] ABSTRACT

A very-wide-dynamic-range amplifier with very low-noise in the high-gain mode and very high-input-overload in the low-gain mode. The amplifier utilizes two parallel signal paths, one a high-gain, low-noise path and the other a low-gain, high-input-overload path. Each path includes a gain-control capability so that the gain of each path, and the contribution of the gain of each path to the overall gain of the amplifier may be smoothly varied from a very low-gain to a very high-gain. Specific embodiments including input impedance matching capabilities are disclosed.

21 Claims, 1 Drawing Sheet

WIDE-DYNAMIC-RANGE VARIABLE-GAIN AMPLIFIER

BACKGROUND OF THE INVENTION

1. Field of the Invention

The present invention relates to the field of integrated circuit amplifiers.

2. Prior Art

There frequently is a need for a very-wide-dynamic-range amplifier having low-noise in the high-gain mode and very high-input-overload capabilities in the low-gain mode. In the prior art, this has been realized by connecting two amplifiers in parallel, one having the desired low-noise and high-gain, and the other having the desired low-gain, high-input-overload capability. In this way, either characteristic may be achieved by enabling the amplifier which has the characteristics desired at the time. Such an arrangement, however, is less than ideal, as it does not provide for a smooth transition between the two very different characteristics while still maintaining high-input-overload characteristics, and does not allow optimization of the operating characteristics of the overall amplifier system under all operating conditions.

BRIEF SUMMARY OF THE INVENTION

A very-wide-dynamic-range amplifier with very low-noise in the high-gain mode and very high-input-overload in the low-gain mode is disclosed. The amplifier utilizes two parallel signal paths, one a high-gain, low-noise path and the other a low-gain, high-input-overload path. Each path includes a gain-control capability so that the gain of each path, and the contribution of the gain of each path to the overall gain of the amplifier, may be smoothly varied from a very low-gain to a very high-gain while always maintaining the desired high-input-overload characteristics. Specific embodiments including input impedance matching capabilities are disclosed.

DETAILED DESCRIPTION OF THE INVENTION

Figure 1:
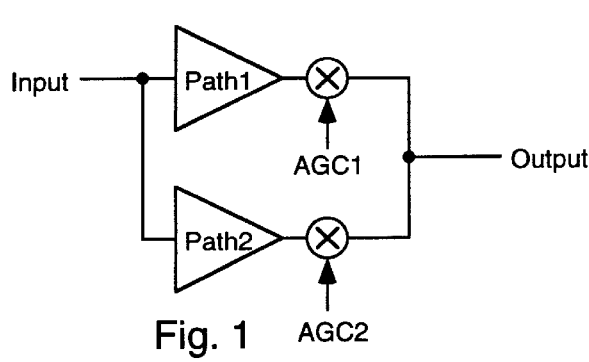
FIG. 1 is a block diagram of the present invention.

In the present invention two wide-dynamic-range variable-gain amplifiers in two parallel signal paths are used, as illustrated schematically in FIG. 1. The first path, PATH1, is comprised of a high-gain, low-noise amplifier with variable-gain-controlled by an automatic-gain-control signal AGC1. The second path, PATH2, is comprised of a low-gain amplifier with a high-input-overload capability and with variable-gain-controlled by an automatic-gain-control signal AGC2. Since the inputs are coupled in parallel, and the outputs of the amplifiers are high-output-impedance currents feeding shared load resistors in the embodiments disclosed, the overall output for the common input is equal to the sum of the outputs of the two signal paths. Typically the circuits of FIGS. 2 and 3 will be fabricated in a single integrated circuit.

Figure 2:
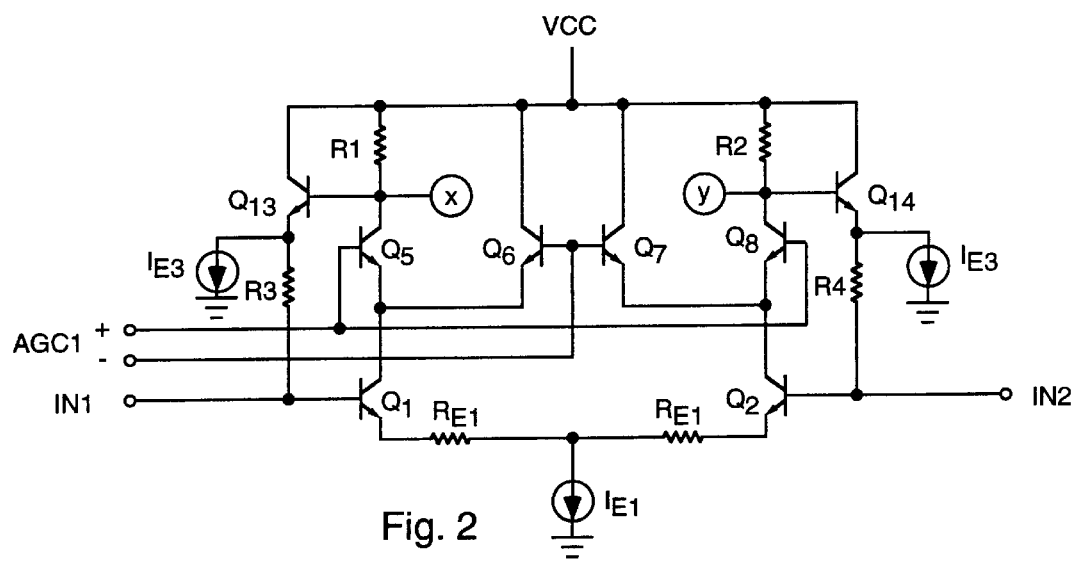
FIG. 2 is a circuit diagram for PATH1, the high-gain, low-noise signal path of the block diagram of FIG. 1.
Figure 3:
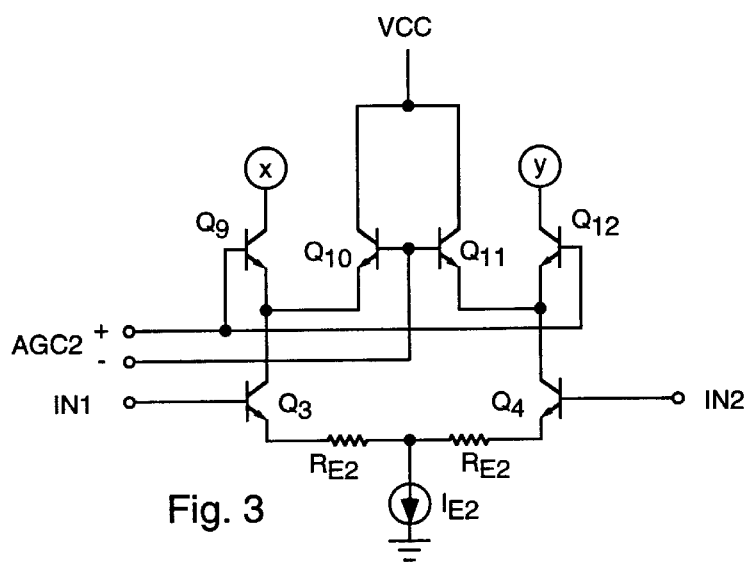
FIG. 3 is a circuit diagram for PATH2, the low-gain, high-overload-capability path of the block diagram of FIG. 1.

FIG. 2 is a circuit diagram for PATH1, the high-gain, low-noise path, together with its automatic-gain-control circuit controlled by the automatic-gain-control signal AGC1, and FIG. 3 is a circuit diagram for PATH2, the low-gain, high-overload-capability path, together with its automatic-gain-control circuit controlled by the automatic-gain-control signal AGC2. In both FIG. 2 and FIG. 3, the gain-control signals AGC1 and AGC2 are differential control signals, as are the input signals IN1 and IN2 and the output signals x and y. In that regard, the differential input signals IN1 and IN2 and the differential output signals x and y of FIG. 3 are connected in parallel to the like identified signals in FIG. 2, as indicated schematically in FIG. 1. The differential outputs x and y are in effect current summing points, summing the currents through transistors Q5 and Q9, and Q8 and Q12, respectively. The collectors of the transistors have a high-output-impedance and do not affect the output current of the transistor having its collector connected in common therewith.

In FIG. 2, current source $I_{E1}$ provides the tail current for the differential input pair of transistors Q1 and Q2, and in FIG. 3, current source $I_{E2}$ provides the tail current for the differential input pair of transistors Q3 and Q4. Also in FIG. 2, resistors $R_{E1}$, and in FIG. 3, resistors $R_{E2}$, are gain-limiting and linearizing resistors, and accordingly since FIG. 2 is the circuit for the high-gain, low-noise amplifier, typically resistors $R_{E1}$ will be of a low value or even be eliminated. Resistors $R_{E2}$ in FIG. 3, however, are chosen in accordance with the limited gain and high linearity desired for the low-gain, high-input-overload amplifier, the two resistors preferably being as well matched as reasonably possible.

Gain-control signal AGC1 (FIG. 2) controls the bases of transistors Q5 and Q8 relative to the bases of transistors Q6 and Q7. Assuming transistors Q5 through Q8 are all the same size, then when the differential gain-control signal AGC1 is zero, the base-emitter voltages of transistors Q5 and Q6 will be equal, so that the collector current of transistor Q1 will divide equally through transistors Q5 and Q6. Similarly, under this condition, the collector current of transistor Q2 will divide equally through transistors Q7 and Q8.

When the gain-control signal AGC1 is fully on (maximum gain), the positive gain-control terminal for AGC1 will be driven sufficiently higher than the negative terminal so that transistor Q5 will be turned on harder and transistor Q6 will be substantially turned off, so that all the collector current of transistor Q1 will flow through transistor Q5. At the same time, all the collector current of transistor Q2 will flow through transistor Q8. Similarly, if the gain-control signal AGC1 is fully negative, the negative gain-control terminal will be driven sufficiently high in comparison to the positive terminal to turn on transistors Q6 and Q7 harder and to substantially fully turn off transistors Q5 and Q8, so that the collector currents of transistors Q1 and Q2 will flow through transistors Q6 and Q7, respectively. Accordingly, transistors Q5 and Q6 form a controllable linear current divider for the current in the collector of transistor Q1, as do transistors Q7 and Q8 for the current in the collector of transistor Q2. In FIG. 3, transistors Q9 and Q10 form a similar linear current divider for the collector current of transistor Q3, and transistors Q11 and Q12 form a similar linear current divider for the current in the collector of transistor Q4.

It should be noted that the controllable current dividers just described are very linear, in that the current division remains very constant over the normal range of currents encountered. In particular, if two identical transistors are operated with different currents there through, the difference in the VBEs of the two transistors will be given by the following equation:

$$V_{BE1} - V_{BE2} = \frac{KT}{q} \ln\left(\frac{I_{C1}}{I_{C2}}\right)$$

where: K=Boltzmann's constant
T=absolute temperature
q=electron charge
$V_{BE1}$, $V_{BE2}$=the base-emitter voltages of the two transistors
$I_{C1}$, $I_{C2}$=the collector currents of the two transistors Thus, at a given absolute temperature, a given difference in the base-emitter voltages of two gain-control transistors, as controlled by the respective gain-control signal (AGC1 of FIG. 2 and AGC2 of FIG. 3), will result in the same division or ratio of the two currents, regardless of the sum of the currents through the two transistors, the sum for any input leg of the amplifier being dependent on the input signal strength. While the current ratio will change with absolute temperature, the system in which the circuit is used will control the gain-control signals to counteract the temperature change as required to maintain the overall desired gain of the circuit throughout the temperature range.

Referring again to FIG. 2, npn transistors Q13 and Q14 have their collectors connected to the positive power-supply VCC, their bases connected to the x and y differential outputs, respectively, and their emitters coupled through resistors R3 and R4, respectively, to a respective one of the differential amplifier inputs IN1 and IN2. Current sources $I_{E3}$ provide bias currents for transistors Q13 and Q14 to establish a predetermined state of conduction through the transistors. Transistors Q13 and Q14 and associated circuitry are optional, though may be provided for impedance matching purposes if desired. In particular, R3 and R4 reduce the input impedance to the amplifier to better match the output impedance of another circuit or device providing the differential input signal thereto. The connection of the resistors R3 and R4 as shown provides much reduced noise in comparison to connecting the resistors between a corresponding differential input and a power-supply terminal. The circuit shown, however, has the disadvantage of making the input impedance of the amplifier gain dependent. In particular, if R3 and R4 were connected to a power-supply terminal, the input impedance to the amplifier would be approximately equal to the value of resistors R3 and R4. As connected however, the input impedance for the amplifier will be equal to R/(1+A), where R is the value of each of resistors R3 and R4, and A is the gain of the amplifier. Accordingly, because one of the features of the present invention is the wide variable-gain range, the input impedance matching using this technique alone is obviously limited, and practically will only provide matching at high-gains if the input impedance is not to be unreasonably low at low-gains.

If better input impedance matching is required, this technique may be used together with another input impedance compensating technique, or alternatively, some other input impedance setting technique may be used. By way of example, a pair of circuits, such as the circuit shown in FIG. 4, may be connected, each to one of the differential inputs IN1 and IN2, the inputs being labeled generally IN in FIG. 4. In this circuit, the current through the resistors $R_M$ and diode D1 is controlled by npn transistor Q15, which in turn is controlled by the voltage $V_M$ on the base of the transistor. The respective differential input signal IN is coupled through capacitor C1 to the midpoint of the two resistors $R_M$. At typical amplifier operating frequencies, the impedance of the capacitor C1 is relatively low, but provides DC blocking so that the circuit of FIG. 4 will not affect low-frequency common-mode voltages on the differential inputs.

When the base voltage $V_M$ on transistors Q15 is low, the transistors will be turned off so that no current will flow through the resistors $R_M$, and of course diodes D1 will not be biased into conduction. Thus, the resistors in essence will be floating so that the circuit will have negligible effect on the input impedance to the amplifier and will not contribute nonlinearity which would compromise the overload capability. This would typically represent the higher gain settings for the amplifier of FIGS. 2 and 3, wherein the input impedance to the amplifier is set by the value of resistors R3 and R4 (A, the gain of the amplifier, being high, yielding the lowest input impedance). As the gain is decreased, the voltage $V_M$ may be increased to VCC to turn on transistors Q15 and drive diodes D1 into substantial conduction. Now the input impedance at normal operating frequencies, as seen at the input IN, will be substantially equal to $R_M/2$.

Figure 4:
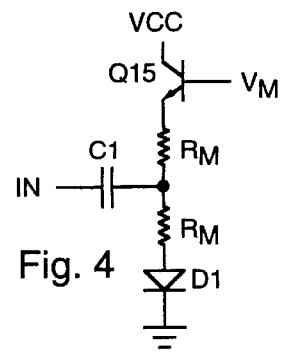
FIG. 4 is a circuit diagram for circuits which may be coupled to each of the differential inputs of the amplifier of FIGS. 2 and 3 for further input impedance adjustment purposes.

In the circuit of FIG. 4, the coupling of the resistors $R_M$ to the input IN could be varied by varying the base voltage of transistor Q15 to vary the current through the resistors $R_M$ from zero to its maximum operating value, typically several milliamps. This increases the incremental impedance of transistors Q15 and diodes D1, so that the effect on the input impedance will be greater than $R_M/2$. This is not preferred, however, as the coupling of additional impedance to the input of the amplifier of FIGS. 2 and 3 would be needed for impedance matching at the lower amplifier gains. Thus, the normal operating excursion of the differential input signal before the amplifier saturates will be greater, increasing the input distortion due to the increased nonlinearities of transistors Q15 and diodes D1 with current changes when operating at low bias current levels.

The present invention provides a very-wide-dynamic-range amplifier with very low-noise in the high-gain mode and very high-input-overload in the low-gain mode, a function which is highly desired in many applications. For small inputs (high-gain), the current source $I_{E2}$ will preferably be turned off and the gain-control signal AGC1 will be set for maximum gain. When the input signal increases above some minimum value, the gain is reduced by control of the gain-control signal AGC1. For larger input signals, current source $I_{E2}$ is turned on and the gain-control signal AGC2 is increased from a substantially zero gain setting as the gain-control signal AGC1 is controlled to further reduce the gain of the high-gain circuit of FIG. 2. Ultimately, in the low-gain, high-overload mode, the current source $I_{E1}$ will be turned off, with gain variations within the low-gain, high-overload mode being controlled entirely by the gain-control signal AGC2. In this state the high-gain amplifier is now turned off and will not contribute any nonlinearity which would compromise the high-overload characteristics desired in the low-gain state. If necessary, the voltage at the node at the top of $I_{E1}$ could be taken somewhat positive in this state to ensure that Q1 and Q2 are in a well-defined off state. Discrete steps in the gain may be avoided when turning either of the current sources on or off by only doing so when the associated gain-control signal is commanding a substantially zero gain from the associated circuit.

The preferred embodiments disclosed herein have been disclosed with respect to the use of npn bipolar transistors for purposes of specificity. It will be apparent to those skilled in the art, however, that other active devices may be used, such as, by way of example, pnp transistors or n-channel or p-channel MOS devices.

While the present invention has been disclosed and described herein with respect to certain preferred embodiments, it will be understood by those skilled in the art that various changes in form and detail may be made therein without departing from the spirit and scope of the invention.

What is claimed is:

1. A wide-dynamic-range variable-gain amplifier comprising:

a first amplifier circuit having a first amplifier input and a first amplifier output, the first amplifier circuit having a variable gain controlled by a first variable gain-control signal, the first amplifier circuit being an amplifier with a high-gain and a low-noise capability;

a second amplifier circuit having a second amplifier input and a second amplifier output, the second amplifier circuit having a variable gain controlled by a second variable gain-control signal, the second amplifier circuit being an amplifier with a low-gain and a high-input-overload capability;

the first amplifier circuit and the second amplifier circuit being coupled in parallel together so that first and second amplifier inputs are coupled together to form an input of the wide-dynamic-range variable-gain amplifier and first and second amplifier outputs are coupled together to form an output of the wide-dynamic-range variable-gain amplifier, the output response of the wide-dynamic-range variable-gain amplifier being a sum of the output response of the first amplifier circuit responsive to the first variable gain-control signal and the output response of the second amplifier circuit responsive to the second variable gain-control signal.

2. The wide-dynamic-range variable-gain amplifier of claim 1 wherein the first and second amplifier inputs are differential inputs each having a first input and a second input with respective first inputs coupled together and respective second inputs coupled together to form a differential input of the wide-dynamic-range variable-gain amplifier.

3. The wide-dynamic-range variable-gain amplifier of claim 1 wherein the first and second amplifier inputs are differential inputs each having a first input and a second input with respective first inputs coupled together and respective second inputs coupled together to form a differential input of the wide-dynamic-range variable-gain amplifier and the first and second amplifier outputs are differential outputs each having a first output and a second output with respective first outputs coupled together and respective second outputs coupled together to form a differential output of the wide-dynamic-range variable-gain differential amplifier.

4. The wide-dynamic-range variable-gain amplifier of claim 3 further comprising:

an input-impedance control circuit coupled to the differential input of the wide-dynamic-range variable-gain amplifier to vary the input impedance of the wide-dynamic-range variable-gain amplifier.

5. A wide-dynamic-range variable-gain amplifier comprising:

first through twelfth transistors, each having first and second regions and a control region, the conduction from the first region to the second region of each transistor being responsive to the voltage on the control region relative to the second region;

the first and second transistors having their second regions coupled together and through a first current source to a second power-supply terminal, the control regions of the first and second transistors forming first and second differential input terminals for the wide-dynamic-range variable-gain amplifier, respectively;

the third and fourth transistors each having their second regions coupled through a respective one of first and second resistors and through a second current source to the second power-supply terminal, the control regions of the third and fourth transistors being coupled to the first and second differential input terminals of the wide-dynamic-range variable-gain amplifier, respectively;

the fifth and sixth transistors having their second regions coupled together and to the first region of the first transistor, the first region of the fifth transistor being coupled to a first of a pair of differential output terminals for the wide-dynamic-range variable-gain amplifier, the first region of the sixth transistor being coupled to a first power-supply terminal;

the seventh and eighth transistors having their second regions coupled together and to the first region of the second transistor, the first region of the eighth transistor being coupled to a second of the pair of differential output terminals of the wide-dynamic-range variable-gain amplifier, the first region of the seventh transistor being coupled to the first power-supply terminal;

the ninth and tenth transistors having their second regions coupled together and to the first region of the third transistor, the first region of the ninth transistor being coupled to the first of the pair of differential output terminals of the wide-dynamic-range variable-gain amplifier, the first region of the tenth transistor being coupled to the first power-supply terminal;

the eleventh and twelfth transistors having their second regions coupled together and to the first region of the fourth transistor, the first region of the twelfth transistor being coupled to the second of the pair of differential output terminals of the wide-dynamic-range variable-gain amplifier, the first region of the eleventh transistor being coupled to the first power-supply terminal;

the control regions of the fifth and eighth transistors being coupled together to form a first of a pair of first differential variable-gain-control input terminals;

the control regions of the sixth and seventh transistors being coupled together to form a second of the pair of first differential variable-gain-control input terminals;

the control regions of the ninth and twelfth transistors being coupled together to form a first of a pair of second differential variable-gain-control input terminals; and, the control regions of the tenth and eleventh transistors being coupled together to form a second of the pair of second differential variable-gain-control input terminals, so that the output response of the wide-dynamic-range variable-gain amplifier is a sum of the output response provided by the first and second transistors on the first and second differential input terminals responsive to a first differential variable-gain-control signal and the output response provided by the third and fourth transistors responsive to a second differential variable-gain-control signal, the circuitry of the first and second transistors to provide high-gain and low-noise amplification and the circuitry of the third and fourth transistors to provide low-gain and high-input-overload capability.

6. The wide-dynamic-range variable-gain amplifier of claim 5 wherein the transistors are bipolar transistors and the first region of each transistor is the collector, the second region of each transistor is the emitter and the control region of each transistor is the base.

7. The wide-dynamic-range variable-gain amplifier of claim 6 wherein the bipolar transistors are npn bipolar transistors.

8. The wide-dynamic-range variable-gain amplifier of claim 1 further comprising:
   a gain-control circuit to generate the first gain-control signal and the second gain-control signal to smoothly vary the gain of the wide-dynamic-range variable-gain amplifier by simultaneously varying the first gain-control signal and the second gain-control signal.

9. The wide-dynamic-range variable-gain amplifier of claim 8 wherein,
   the first gain-control signal and the second gain-control signal are smoothly varied substantially simultaneously by the gain-control circuit in opposite directions to smoothly vary the gain of the wide-dynamic-range variable-gain amplifier between the variable gain of the first amplifier circuit and the variable gain of the second amplifier circuit.

10. The wide-dynamic-range variable-gain amplifier of claim 4 wherein,
    the input-impedance control circuit varies the input impedance of the wide-dynamic-range variable-gain amplifier to match it with the output impedance of another circuit coupled thereto.

11. The wide-dynamic-range variable-gain amplifier of claim 5 wherein,
    the second region of the first transistor and the second region of the second transistor couple together through a third and fourth resistor having matching low resistance values.

12. The wide-dynamic-range variable-gain amplifier of claim 5 further comprising:
    thirteenth and fourteenth transistors, each having first and second regions and a control region, the conduction from the first region to the second region of each transistor being responsive to the voltage on the control region relative to the second region;
    the thirteenth and fourteenth transistors each having first regions coupled together and to the first power supply;
    the control region of the thirteenth transistor being coupled to the first of the pair of differential output terminals and the second region of the thirteenth transistor being coupled to a third current source and the first differential input terminal of the wide-dynamic-range variable-gain amplifier through a fifth resistor; and
    the control region of the fourteenth transistor being coupled to the second of the pair of differential output terminals and the second region of the thirteenth transistor being coupled to the third current source and the second differential input terminal of the wide-dynamic-range variable-gain amplifier through a sixth resistor.

13. The wide-dynamic-range variable-gain amplifier of claim 12 further comprising:
    fifteenth and sixteenth transistors, each having first and second regions and a control region, the conduction from the first region to the second region of each transistor being responsive to the voltage on the control region relative to the second region;
    the fifteenth and sixteenth transistors each having first regions coupled together and to the first power supply,
    the control region of the fifteenth transistor being coupled to a first impedance-matching control terminal and the second region of the thirteenth transistor being coupled to a first node through a seventh resistor, the first node coupled to the first differential input terminal of the wide-dynamic-range variable-gain amplifier through a first capacitor and to the second power supply through a series coupled eighth resistor and first diode,
    the control region of the sixteenth transistor being coupled to a second impedance-matching control terminal and the second region of the sixteenth transistor being coupled to a second node through a ninth resistor, the second node coupled to the second differential input terminal of the wide-dynamic-range variable-gain amplifier through a second capacitor and to the second power supply through a series coupled tenth resistor and second diode.

14. The wide-dynamic-range variable-gain amplifier of claim 13 further comprising:
    an input-impedance control circuit coupled to the first and second impedance-matching control terminals to control the input impedance of the wide-dynamic-range variable-gain amplifier to match it with the output impedance of another circuit coupled thereto.

15. The wide-dynamic-range variable-gain amplifier of claim 5 further comprising:
    a gain-control circuit coupled to the pair of first differential gain-control input terminals to generate a first gain-control signal thereon and coupled to the pair of second differential gain-control input terminals to generate a second gain-control signal thereon, the gain-control circuit to smoothly vary the gain of the wide-dynamic-range variable-gain amplifier by simultaneously varying the first gain-control signal and the second gain-control signal.

16. The wide-dynamic-range variable-gain amplifier of claim 15 wherein,
    a first transistor amplifier circuit includes the first, second, fifth, sixth, seventh and eighth transistors and the first current source, and
    a second transistor amplifier circuit includes the third, fourth, tenth, eleventh, and twelfth transistors, first and second resistors, and the second current source.

17. The wide-dynamic-range variable-gain amplifier of claim 16 wherein,
    the first gain-control signal and the second gain-control signal are smoothly varied substantially simultaneously by the gain-control circuit in opposite directions to smoothly vary the gain of the wide-dynamic-range variable-gain amplifier between a variable-gain of the first transistor amplifier circuit and a variable-gain of the second transistor amplifier circuit.

18. A method of amplifying an input signal, the method comprising:
    providing a high-gain low-noise amplification path having a gain responsive to a first gain-control signal;
    providing a low-gain high-input-overload amplification path having a gain responsive to a second gain-control signal;
    inputting an input signal to the high-gain low-noise amplification path and the low-gain high-input-overload amplification path;

summing the outputs from the high-gain low-noise amplification path and the low-gain high-input-overload amplification path to form the amplified output signal; and smoothly varying the amplification of the amplified output signal by substantially simultaneously varying the first gain-control signal and the second gain-control signal.

19. The method of claim 18 wherein, the first gain-control signal and the second gain-control signal are smoothly varied in opposite directions such that the level of amplification provided smoothly transitions between the high-gain low-noise amplification path and the low-gain high-input-overload amplification path.

20. The method of claim 19 wherein, the first gain-control signal and the second gain-control signal are smoothly varied in opposite directions so that the level of amplification provided smoothly transitions from the high-gain low-noise amplification path to the low-gain high-input-overload amplification path.

21. The method of claim 19 wherein, the first gain-control signal and the second gain-control signal are smoothly varied in opposite directions so that the level of amplification provided smoothly transitions from the low-gain high-input-overload amplification path to the high-gain low-noise amplification path.

* * * * *